(12) United States Patent
Kim

(10) Patent No.: US 9,275,755 B2
(45) Date of Patent: Mar. 1, 2016

(54) SEMICONDUCTOR SYSTEM AND SEMICONDUCTOR PACKAGE

(71) Applicant: SK hynix Inc., Gyeonggi-do (KR)

(72) Inventor: Jung-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 202 days.

(21) Appl. No.: 14/031,867

(22) Filed: Sep. 19, 2013

(65) Prior Publication Data

US 2014/0355370 A1 Dec. 4, 2014

(30) Foreign Application Priority Data

May 28, 2013 (KR) .................. 10-2013-0060309

(51) Int. Cl.
*G11C 29/02* (2006.01)
*G11C 11/406* (2006.01)
*G11C 29/44* (2006.01)

(52) U.S. Cl.
CPC ........ *G11C 29/028* (2013.01); *G11C 11/40615* (2013.01); *G11C 29/023* (2013.01); *G11C 11/40618* (2013.01); *G11C 2029/4402* (2013.01); *G11C 2211/4067* (2013.01)

(58) Field of Classification Search
CPC ... G11C 7/00; G11C 29/028; G11C 11/40615
USPC .......................................... 365/222
See application file for complete search history.

(56) References Cited

U.S. PATENT DOCUMENTS

| 2008/0151670 | A1* | 6/2008 | Kawakubo et al. | ........... 365/222 |
| 2012/0007624 | A1* | 1/2012 | Byeon et al. | ............. 324/750.15 |
| 2012/0008434 | A1* | 1/2012 | Park | ............. 365/194 |
| 2012/0066432 | A1* | 3/2012 | Miura | ........... 711/102 |
| 2012/0262992 | A1 | 10/2012 | Ayukawa et al. | |
| 2012/0263003 | A1* | 10/2012 | Sakakibara et al. | .......... 365/222 |

FOREIGN PATENT DOCUMENTS

KR 1019990042331 6/1999

* cited by examiner

*Primary Examiner* — Huan Hoang
*Assistant Examiner* — Muna A Techane
(74) *Attorney, Agent, or Firm* — IP & T Group LLP

(57) ABSTRACT

A semiconductor system includes a plurality of memory chips. Each of the memory chips includes an oscillator suitable for generating a periodic wave in a self refresh mode, and a delay unit suitable for delaying the periodic wave to generate a refresh pulse and for setting a delay value based on a corresponding chip identification.

20 Claims, 5 Drawing Sheets

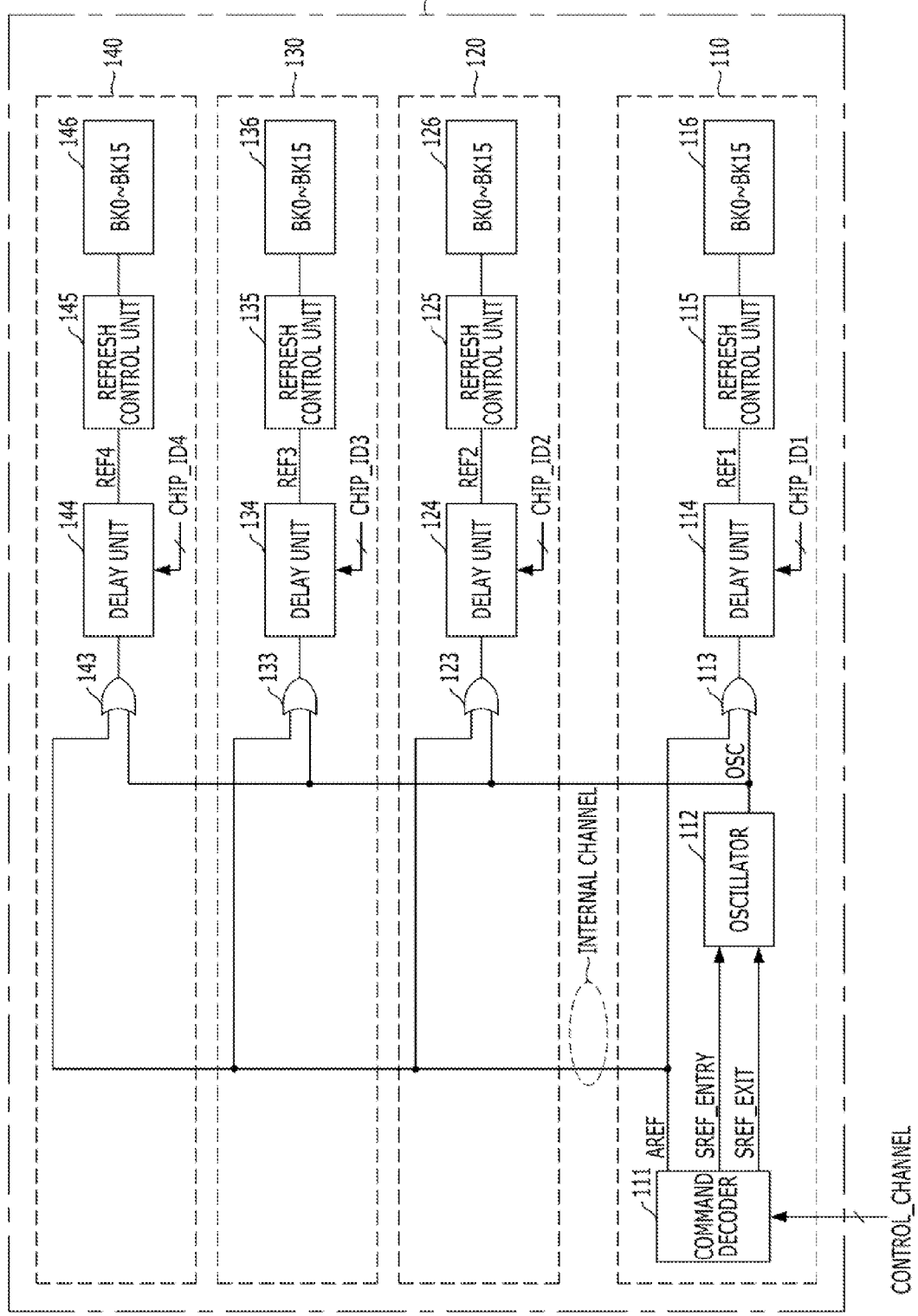

SEMICONDUCTOR SYSTEM AND SEMICONDUCTOR PACKAGE

CROSS-REFERENCE TO RELATED APPLICATIONS

The present application claims priority of Korean Patent Application No 10-2013-0060309, filed on May 28, 2013, which is incorporated herein by reference in its entirety.

BACKGROUND

1. Field

Exemplary embodiments of the present invention relate to a semiconductor system, and more particularly, to a technology for refreshing stored data.

2. Description of the Related Art

A memory cell within a volatile memory device, such as a DRAM, includes a transistor serving as an access element and a capacitor serving as a storage element. According to whether or not a charge is stored in the capacitor of the memory cell, that is, according to whether the terminal voltage of the capacitor is high or low, data is divided into 'high' (logic 1) and 'low' (logic 0).

Since data are retained in such a form that charges are accumulated, no power is theoretically consumed. However, since the initial charge stored in the capacitor disappears due to leakage current caused by a PN junction of a MOS transistor or the like, the data may be lost. In order to prevent the data loss, the data stored in the memory cell must be read before the data are lost, and the memory cell must be normally recharged according to the read information. Such an operation must be periodically performed to retain the data. Such an operation of recharging the memory cell is referred to as a refresh operation.

The refresh operation is divided into an auto refresh operation and a self refresh operation. The auto refresh operation refers to a refresh operation, which is performed whenever an auto refresh command is applied to a memory from a memory controller. The memory controller applies an auto refresh operation to the memory at each predetermined time in consideration of a data retention time of the memory. For example, when the data retention time of the memory is 64 ms and 8,000 refresh commands are to be applied to refresh the entire memory cells of the memory, the memory controller applies 8,000 or more auto refresh commands for 64 ms. The self refresh operation refers to a refresh operation, which the memory performs by itself when the memory controller commands the memory to enter the self refresh mode. During the self refresh mode, the memory repeats a refresh operation at each predetermined period by itself. Since data are rewritten to a large number of memory cells during the refresh operation, a large amount of current is consumed regardless of whether the refresh operation is the auto refresh operation or the self fresh operation.

Recently, the need for a memory that is capable of storing a large amount of data or processing a large amount of data in a short time has been increasing. Thus, a semiconductor device is fabricated according to a method of stacking a plurality of memory chips in one semiconductor package. When the plurality of memory chips stacked in one semiconductor package perform refresh operations at the same time, a huge amount of current may be consumed. There is a demand for a technique capable of alleviating such a concern.

SUMMARY

Various embodiments are directed to a technique for preventing the occurrence of excessive peak current by refresh operations in a memory system including a plurality of memory chips.

In an embodiment, a semiconductor system may include a plurality of memory chips. Each of the memory chips may include an oscillator suitable for generating a periodic wave in a self refresh mode, and a delay unit suitable for delaying the periodic wave to generate a refresh pulse and for setting a delay value based on a corresponding chip identification.

In an embodiment, a semiconductor system may include a master chip and a plurality of slave chips. The master chip may include an oscillator suitable for generating a periodic wave in a self refresh mode, and each of the slave chips may include a delay unit suitable for delaying the periodic wave to generate a refresh pulse and for setting a delay value based on a corresponding chip identification.

In an embodiment, a semiconductor system may include a plurality of memory chips. Each of the memory chips may include a respective delay unit suitable for delaying an auto refresh command to generate a refresh pulse and for setting a delay value based on a corresponding chip identification.

In an embodiment, a semiconductor system may include a plurality of memory chips suitable for performing respective refresh operations based on single refresh command. Timing of the respective refresh operations is separated from each other by using chip identifications assigned to the respective memory chips.

In an embodiment, a semiconductor package may include a master memory chip with command decoder suitable for generating an internal self refresh command, and a plurality of slave memory chips sequentially stacked on the master memory chip, wherein each of the slave memory chips receives the internal self refresh command through an internal channel and generates a respective refresh pulse based on a corresponding chip identification.

BRIEF DESCRIPTION OF THE DRAWINGS

FIG. 5 is a timing diagram illustrating a self refresh operation performed in the semiconductor package shown in FIG. 2.

FIG. 7 is a block diagram illustrating another example of the memory system shown in FIG. 1.

DETAILED DESCRIPTION

Figure 1:
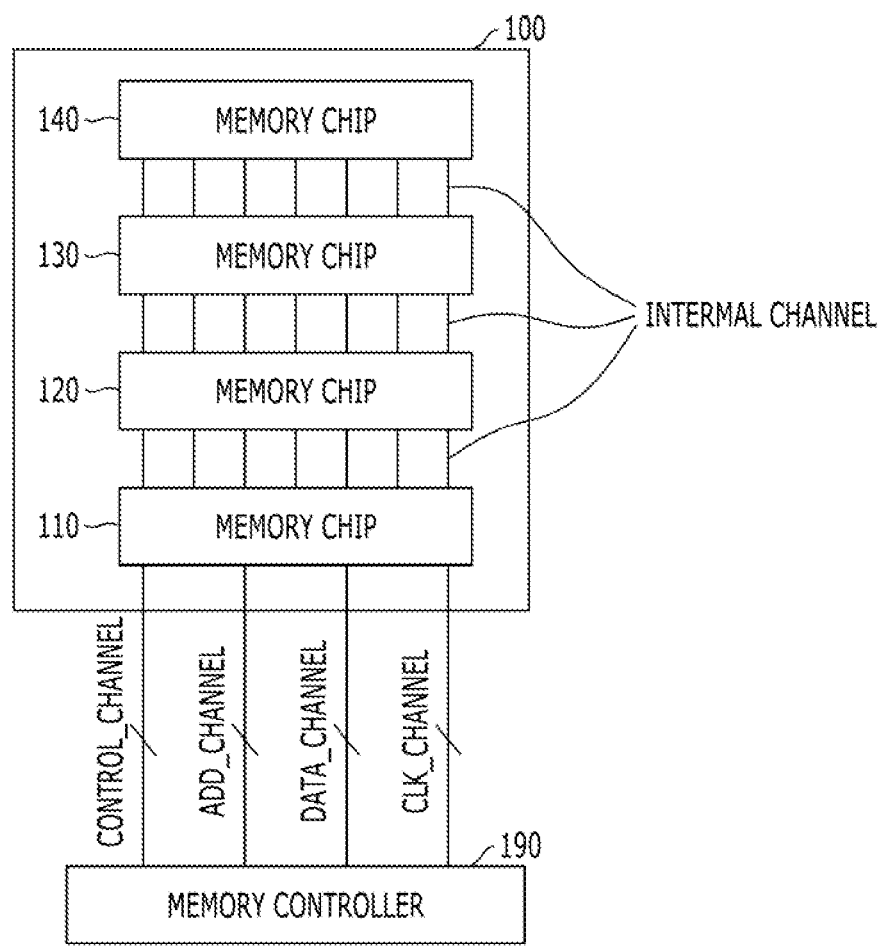
FIG. 1 is a block diagram illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a memory system in accordance with an embodiment of the present invention.

Referring to FIG. 1, the memory system includes a semiconductor package 100 including a plurality of memory chips 110 to 140 and a memory controller 190 to control the semiconductor package 100.

The memory controller 190 and the semiconductor package 100 include a control channel CONTROL_CHANNEL, an address channel ADD_CHANNEL, a data channel DATA_CHANNEL and a clock channel CLK_CHANNEL. Furthermore, a clock CLK for a synchronized operation between the memory controller 190 and the semiconductor package 100 is transmitted. First, the respective channels will be described as follows.

The control channel CONTROL_CHANNEL may serve to transmit signals, which the memory controller 190 uses to control the semiconductor package 100. The control channel CONTROL_CHANNEL includes a multi-bit transmission line. Examples of signals transmitted to the control channel CONTROL_CHANNEL may include a chip select signal CS, an active signal ACT, a row address strobe signal RAS, a column address strobe signal CAS, a write enable signal WE, a clock enable signal CKE, and the like. Examples of commands transferred to the semiconductor package through the control channel CONTROL_CHANNEL may include an active command, a read command, a write command, a precharge command, an auto refresh command, a self refresh entry command, a self refresh exit command, and commands for various settings of the semiconductor package.

The address channel ADD_CHANNEL may transfer address signals indicating the positions of memory cells to be accessed in the semiconductor package 100. The address channel ADD_CHANNEL includes a multi-bit transmission line. The address channel ADD_CHANNEL may transmit a chip address for designating a memory chip to be accessed among the memory chips 110 to 140 of the semiconductor package 100 and an address for indicating the positions of memory cells to be accessed in the designated memory chip, for example, a bank group address, a bank address, or a normal address.

The data channel DATA_CHANNEL may serve to exchange data between the memory controller 190 and the semiconductor package 100. The data channel DATA_CHANNEL includes a multi-bit transmission line. During a write operation, data to be stored in the semiconductor package 100 are transmitted to the semiconductor package 100 from the memory controller 190. During a read operation, data stored in the semiconductor package 100 are transmitted from the semiconductor package 100 to the memory controller 190.

The clock channel CLK_CHANNEL may serve to transmit clock signals for a synchronized operation between the memory controller 190 and the semiconductor package 100. The clock channel CLK_CHANNEL includes a multi-bit transmission line. Examples of signals transmitted to the clock channel CLK_CHANNEL may include a clock signal CLK for synchronizing signals transmitted to the control channel CONTROL_CHANNEL and the address channel ADD_CHANNEL and a data strobe signal DQS for synchronizing data transmitted to the data channel DATA_CHANNEL.

The memory controller 190 may control the semiconductor package 100 to perform an operation through the control channel CONTROL_CHANNEL, and designate an area to be accessed in the semiconductor package 100 through the address channel ADD_CHANNEL. Furthermore, the memory controller 190 exchanges data with the semiconductor package 100 through the data channel DATA_CHANNEL and provides signals for synchronizing the operation of the semiconductor package 100 through the clock channel CLK_CHANNEL.

The semiconductor package 100 includes the memory chips 110 to 140. One chip 110 may operate as a master chip, and the rest of the chips 120 to 140 may operate as slave chips. The memory controller 190 and the semiconductor package 110 directly communicate with each other through the master chip 110, and the slave chips 120 to 140 indirectly communicate with the memory controller 190 through the master chip 110. That is, the channels CONTROL_CHANNEL, ADD_CHANNEL, DATA_CHANNEL, and CLK_CHANNEL between the memory controller 190 and the semiconductor package 100 are connected only to the master chip 110. The master chip 110 and the slave chips 120 to 140 are interfaced through an internal channel of the semiconductor package 100. Through the internal channel, information required for operations of the slave chips 120 to 140 is transmitted. Referring to FIG. 1, the slave chips 120 to 140 may be stacked over the master chip 110, and the internal channel to interface the slave chips 120 to 140 and the master chip 110 may be formed with a through-silicon via (TSV). An operation requiring an address, such as active operation, precharge operation, read operation, or write operation, is performed only in a chip designed by the address among the memory chips 110 to 140. Regardless of which chip among the memory chips 110 to 140 performs a designated operation, the communication with the memory controller 190 is performed through the master chip 110. For example, during a write operation of the slave chip 130, the master chip 110 informs the slave chip 130 that the write operation was commanded through the internal channel, transfers an address through the internal channel, and transfers write data through the internal channel. Operations unrelated to the address transferred from the controller, such as auto refresh and self refresh, may be performed in all of the memory chips 110 to 140 at the same time.

Figure 2:
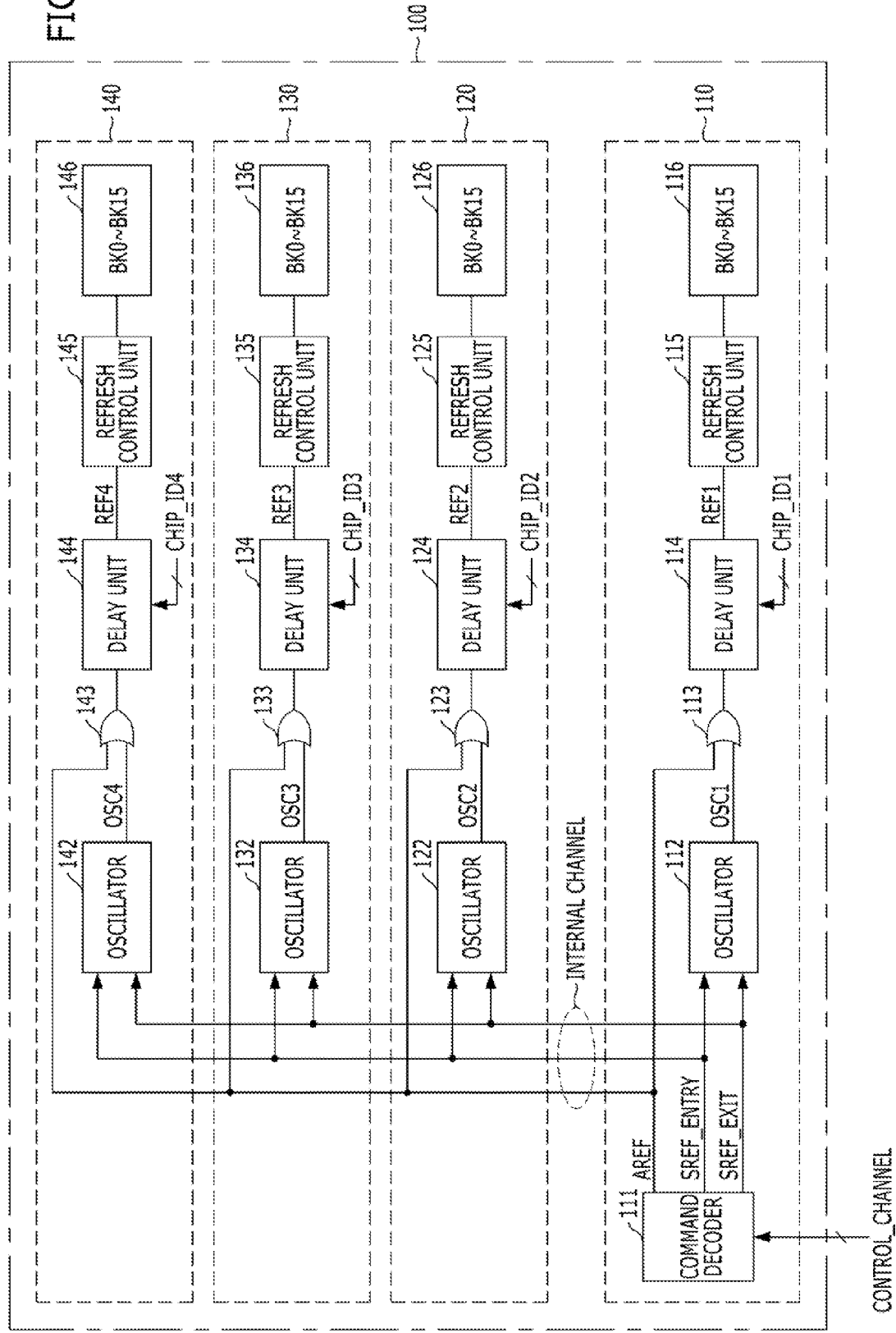
FIG. 2 is a block diagram illustrating an example of a semiconductor package shown in FIG. 1.

FIG. 2 is a block diagram illustrating components related to the refresh operation in the semiconductor package 100 shown in FIG. 1.

A command decoder 111 of the master chip 110 decodes control signals transmitted to the control channel CONTROL_CHANNEL and generates internal commands. The internal commands may include an auto refresh command AREF, a self refresh entry command SREF_ENTRY, and a self refresh exit command SREF_EXIT. The internal commands generated by the command decoder 111 may further include a read command, a write command, an active command, and the like. However, since the read command, the write command, and the active command have no relation with the refresh operation, they are not illustrated. The internal commands AREF, SREF_ENTRY, and SREF_EXIT generated by the command decoder 111 are transferred to the slave chips 120 to 140 through the internal channel.

Oscillators 112, 122, 132, and 142 of the respective memory chips 110 to 140 may generate periodic waves OCS1, OCS2, OSC3, and OSC4, which are activated at a predetermined period during the self refresh mode, that is, from the time point at which the self refresh entry command SREF_ENTRY is activated to the time point at which the self refresh exit command SREF_EXIT is activated. Thus, the activation period of the periodic waves OCS1, OCS2, OSC3, and OSC4 becomes the period of the self refresh operation. The period of the periodic waves OCS1, OCS2, OSC3, and OSC4 generated by the oscillator 112, 122, 132, and 143 may be adjusted through various settings or adjusted according to an internal state change of the chip, for example, temperature change or voltage change.

Delay units 114, 124, 134, and 144 of the respective memory chips 110 to 140 may delay an input signal and generate a refresh pulse REF. OR gates 113, 123, 133, and 143 are provided at the previous stage of the delay units 114, 124, 134, and 144, respectively. In the self refresh mode, the delay units 114, 124, 134, and 144 may delay the periodic waves OCS1, OCS2, OSC3, and OSC4 generated by the oscillators 112, 122, 132, and 143 to generate refresh pulses REF1, REF2, REF3, and REF4, respectively. Furthermore, during an auto refresh operation, the delay units 114, 124, 134, and 144 delay the auto refresh command AREF to generate refresh pulses REF1, REF2, REF3, and REF4 respectively. The delay values of the delay units 114, 124, 134, and 144 are set based on chip identifications (chip IDs) CHIP_ID1 to CHIP_ID4. The chip IDs CHIP_ID1 to CHIP_ID4 serve to identify the memory chips 110 to 140, and the chip IDs CHIP_ID1 to CHIP_ID4 of the memory chips 110 to 140 have different values. When an operation to distinguish the memory chips, for example, a read operation or write operation, is performed, a memory chip among the memory chips 110 to 140 having a chip ID matched to a chip address transferred from the memory controller 190 performs the corresponding operation. The delay values of the delay units 114, 124, 134, and 144 are set by the chip IDs CHIP_ID1 to CHIP_ID4, and the chip IDs of the memory chips 110 to 140 have different values. Thus, the delay units 114, 124, 134, and 144 have different delay values. Each of the chip IDs CHIP_ID1 to CHIP_ID4 may include a multi-bit signal, for example, three-bit signal.

Refresh control units 115, 125, 135, and 145 of the respective memory chips 110 to 140 may control the refresh operations of memory banks 116, 126, 136, and 146 when the refresh pulses REF1, REF2, REF3, and REF4 are activated. In FIG. 2, it is assumed that one memory chip has 16 banks. For example, the refresh control unit 115 controls a zero-th row to be refreshed in the memory banks 116 when the refresh pulse REF1 is activated for the first time, and controls a first row to be refreshed in the memory banks 116 when the refresh pulse REF2 is activated for the second time. Similarly, the refresh control unit 115 controls an (N−1)-th row to be refreshed in the memory banks 116 when the refresh pulse REF1 is activated for the N-th time. For reference, the refresh operation may be performed by activating and precharging the corresponding row.

Referring to FIG. 2, the memory chips 110 to 140 perform the auto refresh operation based on the same auto refresh command AREF. However, since the delay units 114, 124, 134, and 144 have different delay values, the auto refresh operations of the memory chips 110 to 140 are performed at different times. Furthermore, the memory chips 110 to 140 enter or exit from the self refresh mode at the same time. However, since the delay units 114, 124, 134, and 144 have different delay values, the self refresh operations of the memory chips 110 to 140 are performed at different times. Thus, the excessive peak current, which may occur when the memory chips 110 to 140 of the semiconductor package 100 perform the refresh operation at the same time, may be prevented.

Figure 3:
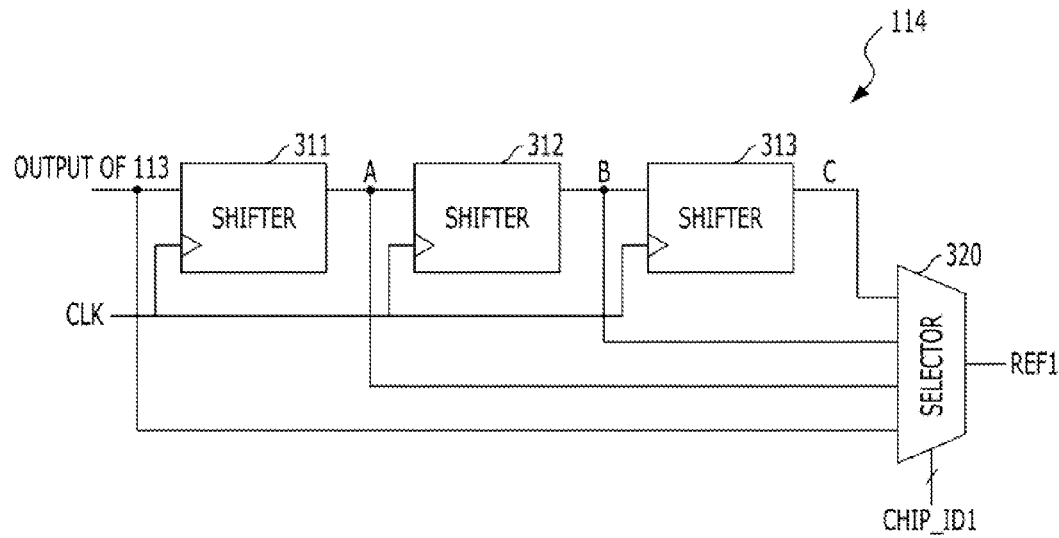
FIG. 3 is a detailed diagram illustrating a delay unit shown in FIG. 2.

FIG. 3 is a detailed diagram illustrating the delay unit 114 shown in FIG. 2.

Referring to FIG. 3, the delay unit 114 includes a plurality of shifters 311 to 313 and a selector 320.

Each of the shifters 311 to 313 may shift (or delay) a signal inputted thereto by one clock and output the shifted signal, and may include a D flip-flop suitable for operating in synchronization with the clock CLK.

The selector 320 may select one of the signals of the delay unit 114 and output signals A, B, and C of the shifters 311 to 313 based on the chip ID CHIP_ID1. The input signal of the delay unit 114 corresponds to an output signal of the OR gate 113. For example, when the chip ID CHIP_ID1 includes a three-bit signal, a signal outputted as the refresh pulse REF<i> based on the value of e chip ID CHIP_ID<i> may be set as shown in Table 1 below.

TABLE 1

| Value of CHIP_ID<i> | Signal selected as REF<i> |
|---|---|
| CHIP_ID1 (0, 0, 1) | Output of 113 |
| CHIP_ID2 (0, 1, 0) | A |
| CHIP_ID3 (0, 1, 1) | B |
| CHIP_ID4 (1, 0, 0) | C |

The delay units 124, 134, and 144 may be configured in the same manner as the delay unit 114 of FIG. 3. Furthermore, general delay lines operating in an asynchronous manner may be used instead of the shifters 311 to 313 operating in synchronization with the clock CLK.

Figure 4:
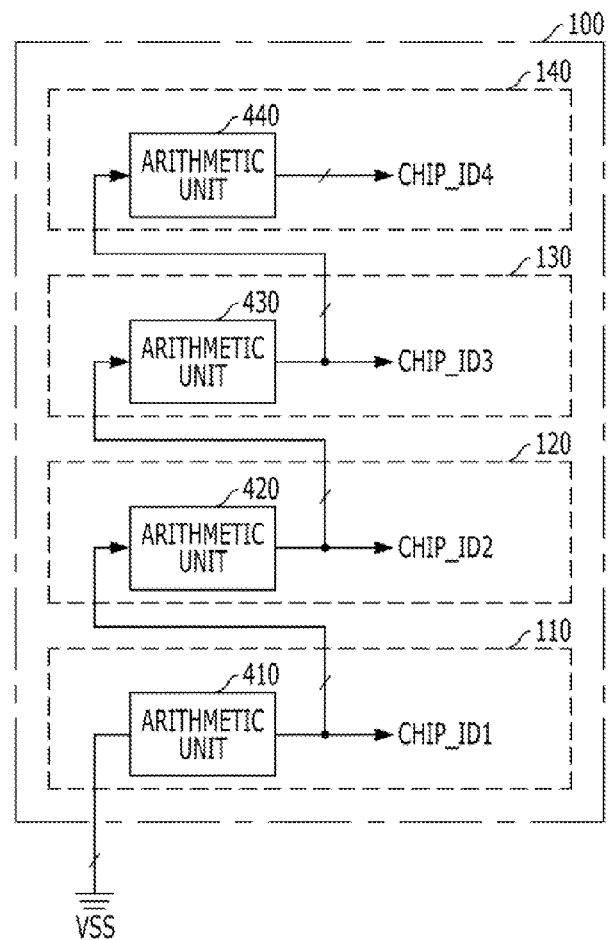
FIG. 4 is a block diagram illustrating an example of generating chip identifications of memory chips.

FIG. 4 is a block diagram illustrating an example of generating the chip IDs CHIP_ID1 to CHIP_ID4 of the memory chips 110 to 140. FIG. 4 illustrates only components, which are directly related to the generation of the chip IDs CHIP_ID1 to CHIP_ID4 in the memory chips 110 to 140.

Referring to FIG. 4, the memory chips 110 to 140 include arithmetic units 410, 420, 430, and 440, respectively. The arithmetic units 410, 420, 430, and 440 are connected in series, and an output of an arithmetic unit at a previous stage becomes an input of an arithmetic unit at a next stage. For example, an output of the arithmetic unit 420 becomes an input of the arithmetic unit 430. The input of the arithmetic unit 410 at the first stage is grounded.

Each of the arithmetic units 410, 420, 430, and 440 adds a predetermined value, for example, to the input value and generates its chip ID. For example, the arithmetic unit 410 adds one to the input value (0, 0, 0) and generates the chip ID CHIP_ID1 as (0, 0, 1), the arithmetic unit 420 adds one to the input value (0, 0, 1) and generates the chip ID CHIP_ID2 as (0, 1, 0), the arithmetic unit 430 adds one to the input value (0, 1, 0) and generates the chip ID CHIP_ID3 as (0, 1, 1), and the arithmetic unit 440 adds one to the input value (0, 1, 1) and generates the chip ID CHIP_ID4 as (1, 0, 0).

FIG. 4 illustrates an example of the method for generating the CHIP IDs CHIP_ID1 to CHIP_ID4 of the memory chips 110 to 140. For example, when the memory chips 110 to 140 are fabricated, the chip IDs CHIP_ID1 to CHIP_ID4 may be permanently or semi-permanently recorded in the memory chips 110 to 140.

Figure 5:
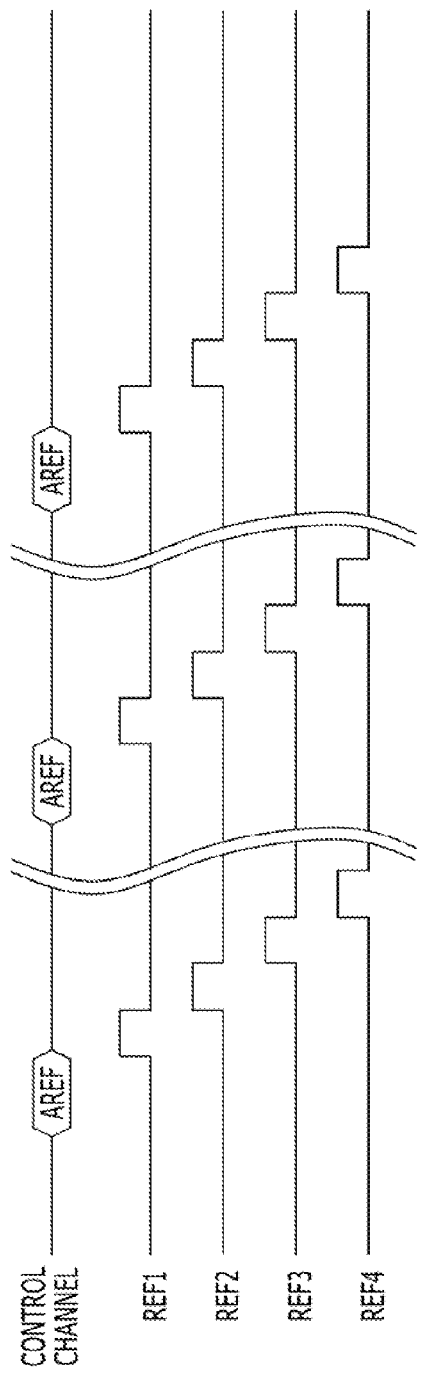
FIG. 5 is a timing diagram illustrating an auto refresh operation performed by the semiconductor package shown in FIG. 2.

FIG. 5 is a timing diagram illustrating the auto refresh operation performed by the semiconductor package 100 shown in FIG. 2.

Referring to FIG. 5, whenever the auto refresh command AREF is applied to the semiconductor package 100 through the control channel CONTROL_CHANNEL, refresh operations are performed in all of the memory chips 110 to 140. However, since the delay units 114, 124, 134, and 144 have different values, the refresh pulses REF1, REF2, REF3, and REF4 are activated at different time in the memory chips 110 to 140. Thus, the memory chips 1 to 140 perform the refresh operation at different timings.

Figure 6:
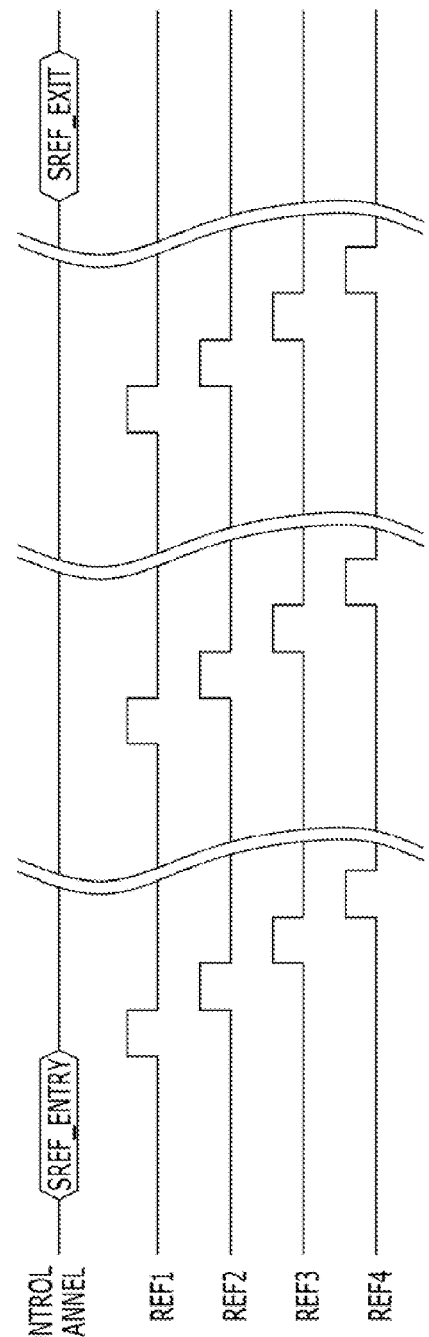

FIG. 6 is a timing diagram illustrating the self refresh operation performed in the semiconductor package 100 shown in FIG. 2.

Referring to FIG. 6, the memory chips 110 to 140 periodically perform a refresh operation during the self refresh mode. The self refresh mode lasts from the time point at which the self refresh entry command SREF_ENTRY is applied to the semiconductor package 100 through the control channel CONTROL_CHANNEL to the time point at which the self refresh exit command SREF_EXIT is applied. However, sine the delay units 114, 124, 134, and 144 have different values, the refresh pulses REF1, REF1, REF3, and REF4 of the memory chips 110 to 140 are activated at different time. Thus, the memory chips 110 to 140 perform the refresh operations at different timings.

FIG. 7 is a block diagram illustrating another example of the memory system shown in FIG. 1.

Referring to FIG. 7, not all of the memory chips 110 to 140 have an oscillator, and the oscillator 112 of the memory chip 110 is shared. That is, the periodic wave OSC generated by the oscillator 112 of the memory chip 110 is transmitted to the memory chips 120 to 140 through the internal channel. FIG. 7 illustrates that the memory chip 110 includes the delay unit 114, but the delay unit 114 of the memory chip 110 may be omitted.

The memory system of FIG. 7 operates in substantially the same manner as the memory system of FIG. 2, except that the oscillator 112 is shared by the memory chip 110 to 140. Thus, the detailed descriptions thereof are omitted herein.

In the embodiments of the present invention, it has been described that the memory chips to perform a refresh operation based on the same refresh command are provided in the semiconductor package. However, the present invention may be applied to a case in which memory chips are provided in various types of semiconductor systems, for example, a system-on-chip including a plurality of memories, a circuit board including a plurality of memory chips, and the like.

In accordance with the embodiments of the present invention, the occurrence of excessive peak current caused by the refresh operations performed for the memory chips in the semiconductor system may be prevented.

Although various embodiments have been described for illustrative purposes, it will be apparent to those skilled in the art that various changes and modifications may be made without departing from the spirit and scope of the invention as defined in the following claims.

What is claimed is:

1. A semiconductor system comprising a plurality of memory chips, wherein each of the memory chips comprises:
an oscillator suitable for generating a periodic wave in a self refresh mode;
a delay unit suitable for delaying the periodic wave to generate a refresh pulse and for setting a delay value based on a corresponding chip identification; and
an arithmetic unit for receiving a preceding chip identification generated from an arithmetic unit of a preceding memory chip to generate the corresponding chip identification, wherein the corresponding chip identification is generated by adding a predetermined value to the received preceding chip identification.

2. The semiconductor system of claim 1, wherein each of the memory chips performs a refresh operation whenever the corresponding refresh pulse is activated.

3. The semiconductor system of claim 1, wherein each of the memory chips further comprises a refresh control unit suitable for controlling rows to be sequentially activated in the corresponding memory chip, whenever the corresponding refresh pulse is activated.

4. The semiconductor system of claim 1, wherein the memory chips are stacked in one semiconductor package.

5. The semiconductor system of claim 4, wherein an arithmetic unit provided in the most preceding memory chip receives an initial value.

6. A semiconductor system comprising a master chip and a plurality of slave chips,
wherein the master chip comprises an oscillator suitable for generating a periodic wave in a self refresh mode, and
each of the slave chips comprises a delay unit suitable for delaying the periodic wave to generate a refresh pulse and for setting a delay value based on a corresponding chip identification,
wherein each of the slave chips comprises an arithmetic unit for receiving a preceding chip identification generated from an arithmetic unit of a preceding chip to generate the corresponding chip identification, and
wherein the corresponding chip identification is generated by adding a predetermined value to the received preceding chip identification.

7. The semiconductor system of claim 6, wherein the master chip performs a refresh operation whenever the periodic wave is activated, and each of the slave chips performs a refresh operation whenever the corresponding refresh pulse is activated.

8. The semiconductor system of claim 6, wherein the master chip further comprises a delay unit suitable for delaying the periodic wave to generate a refresh pulse and for setting a delay value based on the corresponding chip identification, and
each of the master chip and the slave chips performs a refresh operation whenever the corresponding refresh pulse is activated.

9. The semiconductor system of claim 8, wherein the master chip and the slave chips are stacked in one semiconductor chip.

10. The semiconductor system of claim 9, wherein the slave chip comprises an arithmetic unit suitable for receiving an initial value.

11. A semiconductor system comprising a plurality of memory chips,
wherein each of the memory chips comprises:
a delay unit suitable for delaying an auto refresh command to generate a refresh pulse and for setting a delay value based on a corresponding chip identification; and
an arithmetic unit for receiving a preceding chip identification generated from an arithmetic unit of a preceding memory chip to generate the corresponding chip identification, wherein the corresponding chip identification is generated by adding a predetermined value to the received preceding chip identification.

12. The semiconductor system of claim 11, wherein each of the memory chips performs a refresh operation whenever the refresh pulse is activated.

13. The semiconductor system of claim 11, wherein each of the memory chips further comprises a refresh control unit suitable for controlling rows to be sequentially activated in the corresponding memory chip, whenever the corresponding refresh pulse is activated.

14. The semiconductor system of claim 11, wherein the plurality of memory chips are stacked in one semiconductor package.

15. A semiconductor system comprising a plurality of memory chips suitable for performing respective refresh operations based on single refresh command,
   wherein timing of the respective refresh operations is separated from each other by using chip identifications assigned to the respective memory chips, and
   an arithmetic unit suitable for receiving a preceding chip identification generated from an arithmetic unit of a preceding memory chip to generate the corresponding chip identification, wherein the corresponding chip identification is generated by adding a predetermined value to the received preceding chip identification.

16. The semiconductor system of claim 15, wherein the memory chips enter a self refresh mode based on a self refresh entry command, and exit from the self refresh mode based on a self refresh exit command.

17. The semiconductor system of claim 15, wherein the memory chips perform the respective refresh operations based on an auto refresh command.

18. A semiconductor package comprising:
   a master memory chip with command decoder suitable for generating an internal self refresh command; and
   a plurality of slave memory chips sequentially stacked on the master memory chip, wherein each of the slave memory chips receives the internal self refresh command through an internal channel and generates a respective refresh pulse based on a corresponding chip identification,
   wherein each of the slave memory chip comprises an arithmetic unit for receiving a preceding chip identification generated from an arithmetic unit of a preceding chip to generate the corresponding chip identification, and
   wherein the corresponding chip identification is generated by adding a predetermined value to the received preceding chip identification.

19. The semiconductor package of claim 18, wherein each of the respective refresh pulses is activated with a predetermined interval.

20. The semiconductor package of claim 18, wherein each of slave memory chips comprises:
   an oscillator suitable for generating a periodic wave with a predetermined frequency based on the internal self refresh command; and
   a delay unit suitable for delaying the periodic wave to generate the respective refresh pulse, wherein the delay unit set a delay value based on the corresponding chip identification.

* * * * *